United States Patent [19]

Kawakatsu

[11] Patent Number: 4,735,912

[45] Date of Patent: Apr. 5, 1988

[54] PROCESS OF FABRICATING A SEMICONDUCTOR IC DEVICE

[75] Inventor: Akira Kawakatsu, Tokyo, Japan

[73] Assignee: Oki Electric Industry Co., Ltd., Tokyo, Japan

[21] Appl. No.: 57,510

[22] Filed: Jun. 3, 1987

[30] Foreign Application Priority Data

Jun. 9, 1986 [JP] Japan .................. 61-131698

[51] Int. Cl.$^4$ .................. H01L 21/385; H01L 21/425
[52] U.S. Cl. .................. 437/33; 437/060; 437/162
[58] Field of Search .................. 437/33, 60, 162

[56] References Cited

U.S. PATENT DOCUMENTS

| | | | |
|---|---|---|---|
| 4,318,751 | 3/1982 | Horng | 437/30 |
| 4,319,932 | 3/1982 | Jambotkar | 437/33 X |
| 4,381,953 | 5/1983 | Ho et al. | 437/33 X |
| 4,398,962 | 8/1983 | Kanazawa | 437/33 X |
| 4,481,706 | 11/1984 | Roche | 437/33 |
| 4,495,010 | 1/1985 | Kranzer | 437/33 X |
| 4,590,666 | 5/1986 | Goto | 437/33 |
| 4,591,398 | 5/1986 | Ouchi et al. | 437/33 |
| 4,691,436 | 9/1987 | Hirao | 437/33 |

FOREIGN PATENT DOCUMENTS 19373 1/1984 Japan .

Primary Examiner—George T. Ozaki
Attorney, Agent, or Firm—Spencer & Frank

[57] ABSTRACT

In a process of fabricating a semiconductor IC device, a semiconductor substrate (1) having a first region (3) of a first conduction type which is electrically isolated is prepared, on which a polycrystalline semiconductor layer, and oxidation-resistant layers ($8_1$, $8_2$) are formed in turn. In part of the first region that is not covered by the oxidation-resistant layers, second regions ($6_2$, $6_2$) of a second conduction type are formed. Parts of the polycrystalline semiconductor layer that are not covered by the oxidation-resistant layers are selectively oxidized. After removal of the oxidation-resistant layers, an impurity of the second conduction type is introduced in the polycrystalline semiconductor layers, and is diffused therefrom into parts of the first regions beneath them to form therein a third region (10) and a fourth region ($6_1$) of the second conduction. Selected parts of the surfaces of the polycrystalline layers are exposed. An impurity of the first conduction type is introduced through the exposed surface in the polycrystalline semiconductor layer on the fourth region ($6_1$), and diffused therefrom into part of the fourth region to form therein a fifth region (11) of the first conduction type.

15 Claims, 8 Drawing Sheets

PROCESS OF FABRICATING A SEMICONDUCTOR IC DEVICE

BACKGROUND OF THE INVENTION

The present invention relates to a process of fabricating a semiconductor IC device, particularly a bipolar semiconductor IC device which is suitable for higher integration and higher operating speed.

Where high speed operations are required, bipolar semiconductor IC devices of ECL/CML (emitter coupled logic/current mode logic) are widely used.

Where the power consumption and the logic swing is fixed in ECL/CML circuits, the operating speed of the circuit is determined mainly by the base resistance $r_b$ and, the gain-bandwidth product $f_T$ of the transistors constituting the circuit, and the parasitic capacitances of the transistors, resistors and wiring conductors.

To reduce the parasitic capacitances, thick oxide is used for isolation between elements. To reduce the base-collector junction capacitance which has a great effect on the operating speed, polysilicon is used to draw the base electrode out of the element region to reduce the base area. Moreover, polysilicon resistors and metal wiring conductors are formed on the isolation oxide.

To reduce the base resistance $r_b$, inactive base regions are made to have lower resistance and the emitter regions are made to have smaller width, thereby to reduce the resistance of the active base layer immediately under the emitter region. To improve the gain-bandwidth product $f_T$, it is necessary to make shallow the junction of emitter and active base layers.

A prior art fabrication to produce a device having the above described features is shown in Japanese Patent Application Laid-open No. 19373/84 and will be described briefly with reference to FIGS. 1A through 1G.

FIG. 1A shows a state in which an isolation oxide film 4 has been formed for inter-element isolation on a P$^-$ silicon substrate 1, and an N$^+$ collector sink region 5 for reducing the collector resistance has been formed. FIG. 1A also shows an N$^+$ buried layer 2 and an N$^-$ epitaxial layer 3.

Then, as shown in FIG. 1B, a heavy boron compound, e.g., BF$_2$$^+$ is ion-implanted on the surface of the epitaxial layer 3 to form an active base layer 6$_1$, and a polysilicon layer 7 and an oxidation-resistant film 8 comprising a silicon nitride film on a thin silicon oxide film are formed.

Subsequently, as shown in FIG. 1C, resist layers 80$_1$, 80$_2$, 80$_3$ and 80$_4$ are used for an etching to leave necessary parts of the oxidation-resistant film 8$_1$, 8$_2$, 8$_3$ and 8$_4$. The resist layers 80$_1$, 80$_2$, 80$_3$, and 80$_4$ and the oxidation-resistant films 8$_1$, 8$_2$, 8$_3$ and 8$_4$ serve as a mask in a subsequent boron ion implantation by which a high concentration base region 6$_2$ is formed in part of the active base region.

Next, the resist layers 80$_1$ to 80$_4$ are removed, and an annealing is conducted. Then, as shown in FIG. 1D, polysilicon layer 7 is selectively oxidized by high pressure oxidation to form oxide films 9 isolating the polysilicon layers 7$_1$, 7$_2$ and 7$_3$ to become electrodes of the transistor and the polysilicon layer 7$_4$ to become a resistor.

The oxidation-resistant films 8$_1$ through 8$_4$ are then removed, and the surfaces of the polysilicon layers 7$_1$ through 7$_4$ are oxidized to form thin oxide. Then, as shown in FIG. 1E, arsenic is ion-implanted to a high concentration in the polysilicon layers 7$_2$ and 7$_3$ using resist layers 80$_5$, 80$_6$ and 80$_7$ as a mask.

To introduce arsenic having a short projected range sufficiently into the polysilicon layers 7$_2$ and 7$_3$, excessive etching is necessary at the time of removing the silicon oxide film or the lower layer of the oxidation resistant film for removing bird's beaks which are formed at the time of the selective oxidation, and extend from the periphery towards the center of the polysilicon patterns.

The resist layers 80$_5$ through 80$_7$ are removed and then oxidation is conducted at a relatively low temperature to grow an oxide film. As shown in FIG. 1F, the resultant oxide film is thicker on the polysilicon layers 7$_2$ and 7$_3$ containing arsenic at a high concentration, than on the polysilicon layers 7$_1$ and 7$_4$. Utilizing this difference in thickness for self alignment, boron is ion-implanted in the polysilicon layers 7$_1$ and 7$_4$ to a high concentration, and heat treatment is conducted to form a low-resistance inactive base 10 and emitter 11.

After that, as shown in FIG. 1G, contact holes are opened and metal electrodes 12$_1$, 12$_2$, 12$_3$, 12$_4$ and 12$_5$ are formed. By virtue of the thick oxide films surrounding the polysilicon patterns, the contact holes can be formed by self-alignment to have larger dimensions than the corresponding polysilicon electrodes.

Both ends of the emitter 11 in the direction normal to the page of the drawing have a walled emitter structure, in which the emitter 11 bounds on the isolation oxide film 4.

By the above-described process, transistors with the walled-emitter configuration can be easily fabricated. Moreover, since the base electrode is drawn out of the element region by means of polysilicon 7$_1$, the base area is substantially reduced and the collector-base junction capacitance is reduced.

In addition, the inactive base 10 and, the high-concentration base region 6$_2$ both have low resistance, so that the base resistance $r_b$ is also reduced.

The above-described process have the following problems: First, the base junction in the completed device, i.e., after the emitter formation, becomes about 0.4 micrometers even if the active base 6$_1$, is initially formed in the shallow region by use of ion-implantation of a heavy compound such as BF$_2$$^+$. This is because, during the selective oxidation of polysilicon, the diffusion proceeds. It is therefore difficult to make the gain-bandwidth product $f_T$ be 5 GHz or more.

Secondly, at the time of removing the oxidation-resistant films 8$_1$ to 8$_4$, the silicon oxide film 9 must be excessively etched, as described above. As a result, when the contact hole is opened, the part of the base adjacent the emitter may be exposed, and consequently the exposed base and the emitter may be shorted by the metal electrode.

Thirdly, variation or fluctuation in various conditions during the active base formation and the emitter formation, e.g., the thickness of polysilicon layer, the width of the emitter, temperature distribution during the selective oxidation, effects the depth of the active base and the emitter. For this reason, the characteristics of the transistor, particularly the current amplification factor $h_{FE}$ differs from one place to another on the same wafer and from one wafer to another, and the reproducibility between production lots is poor.

SUMMARY OF THE INVENTION

An object of the invention is to provide a process of fabricating a semiconductor IC device having a high gain-bandwidth product $f_T$ of more than 5 GHz.

Another object of the invention is to reduce the possibility of the base and the emitter being shorted.

A further object of the invention is to reduce the difference in the current amplification factor $h_{FE}$ from one place to another in the same wafer, and from one wafer to another, and to improve the reproducibility between production lots.

According to the invention, there is provided a process of fabricating a semiconductor IC device comprising the steps of:

(a) preparing a semiconductor substrate (1) having a first region (3) of a first conduction type which is electrically isolated, (b) forming a polycrystalline semiconductor layer (7) on the semiconductor substrate, (c) forming oxidation-resistant layers ($8_1$, $8_2$) on the polycrystalline semiconductor layer, (d) forming, in part of the first region that is not covered by the oxidation-resistant layers, second regions ($6_2$, $6_2$) of a second conduction type, (e) selectively oxidizing parts of the polycrystalline semiconductor layer that are not covered by the oxidation-resistant layers, (f) removing the oxidation-resistant layers, (g) introducing an impurity of the second conduction type in the polycrystalline semiconductor layers, (h) diffusing the impurity from the polycrystalline semiconductor layers into parts of the first regions beneath the polycrystalline semiconductor layers to form therein, a third region (10) and a fourth region ($6_1$) of the second conduction, (i) exposing selected parts of the surfaces of the polycrystalline layers, (j) introducing an impurity of the first conduction type in the polycrystalline semiconductor layer on the fourth region ($6_1$) through the exposed surface, and (k) diffusing the impurity from the polycrystalline layer into part of the fourth region to form therein, a fifth region (11) of the first conduction type.

With the above described process, particularly with the additional steps, the active base and the emitter are formed by diffusion from the same polysilicon layer to have a shallow junction, and the excessive etching of the oxide film surrounding the emitter is avoided. The various problems described above have thereby been eliminated.

DESCRIPTION OF THE PREFERRED EMBODIMENTS

Figure 1A:
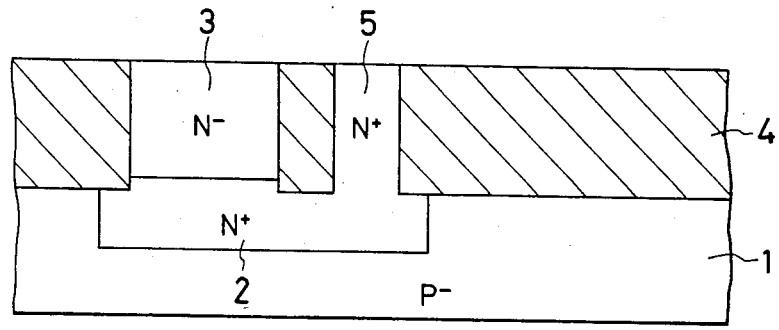
FIGS. 1A to 1G are cross sectional views showing various production steps of a prior art process.
Figure 1B:
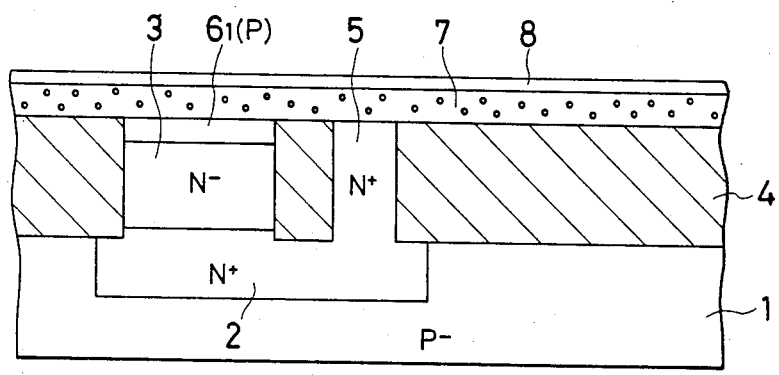
Figure 1C:
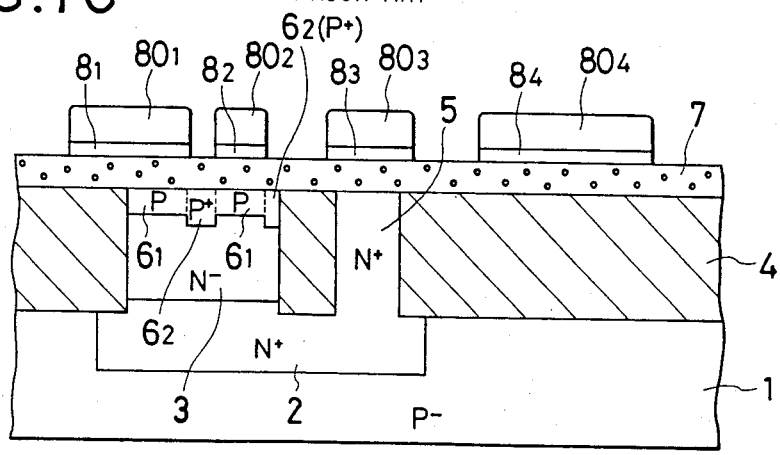

An embodiment of the process of fabricating a semiconductor IC device according to the invention will be described with reference to FIGS. 2A through 2H, showing various steps of the process. In these figures, the same reference numerals as in FIGS. 1A through 1G denote identical or similar parts or members and their descriptions are mostly omitted.

Figure 2A:
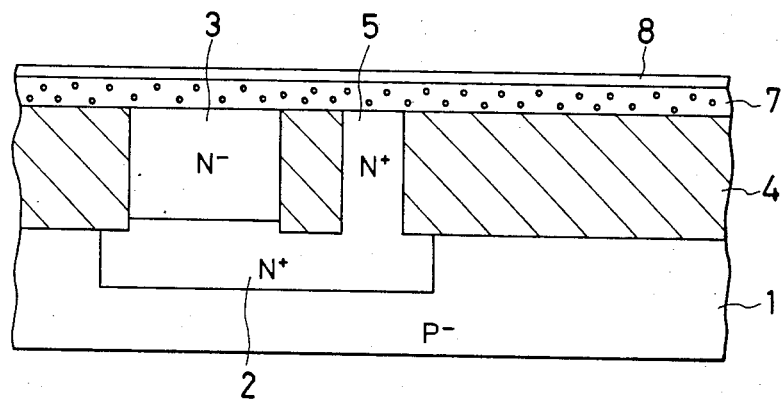
FIGS. 2A to 2H are cross sectional views showing various production steps of a process of the invention.

In the same way as in FIG. 1A of the prior art process, element isolation is conducted and an N+ collector sink region 5 is formed, and immediately thereafter, a polysilicon layer 7 and an oxidation resistant layer 8 are formed in FIG. 2A.

Figure 2B:
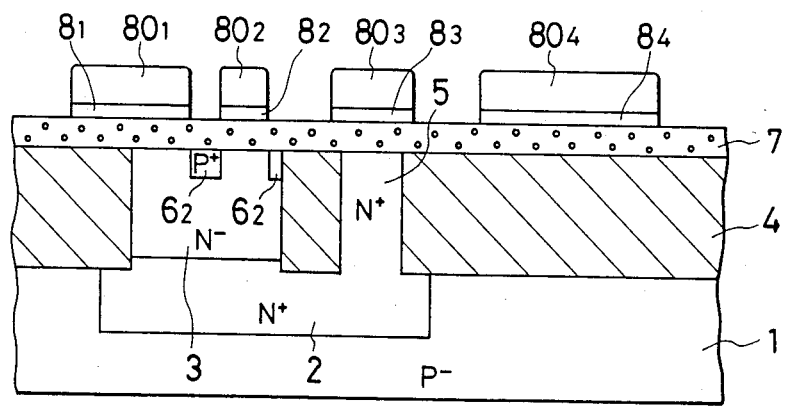

The polysilicon layer 7 has a thickness of 2000 to 5000 Å, and preferably of 3000 Å. The oxidation-resistant layer 8 comprises two layers, i.e., a first layer of a silicon oxide of about 200 Å formed by thermal oxidation of the polysilicon layer and a second layer of silicon nitride formed on the silicon oxide layer by CVD to have a thickness of 500 to 2000 Å. Next, photo-resist layers $80_1$ to $80_4$ of the desired pattern are formed on the oxidation-resistant layer 8, and then, using the photo-resist layers, the oxidation-resistant layer 8 is subjected to photo-etching to leave the oxidation-resistant layers $8_1$ to $8_4$ at the desired parts, as shown in FIG. 2B. Then, using the resist layers $80_1$ to $80_4$ and the remaining oxidation-resistant layers $8_1$ to $8_4$ as a mask, boron is ion-implanted through the polysilicon layer 7 into the surface region of the N− epitaxial layer 3 at a dose of 1 to $5 \times 10^{14}$ cm$^{-2}$, thereby forming a high concentration base layer $6_2$ constituting part of an inactive base. The energy of the ion implantation is about 150 KeV if the polysilicon layer 7 is 3000 Å in thickness.

Figure 2C:
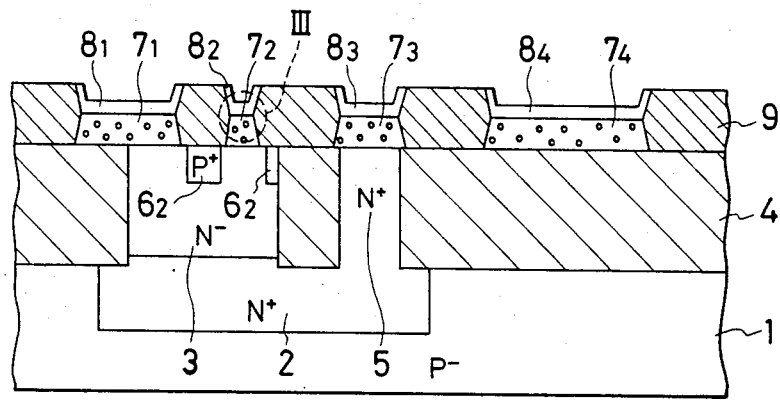
Figure 3:
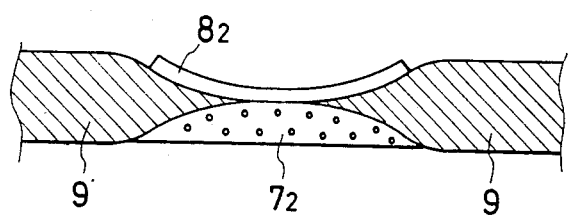
FIGS. 3 and 4 are cross sectional views showing details of part III and IV in FIGS. 2C and 2D, respectively.

Then the resist layers $80_1$ to $80_4$ are removed, and, if necessary, a suitable annealing is conducted, and selective oxidation of the polysilicon layer 7 is conducted and, as shown in FIG. 2C and FIG. 3, the polysilicon layers $7_1$ to $7_3$ which are to become electrodes of the transistor and the polysilicon layer $7_4$ to become a resistor are isolated by silicon oxide film 9 from each other.

Preferably, the selective oxidation should be conducted by high-pressure oxidation to restrain diffusion at the high concentration base layer $6_2$.

Figure 2D:
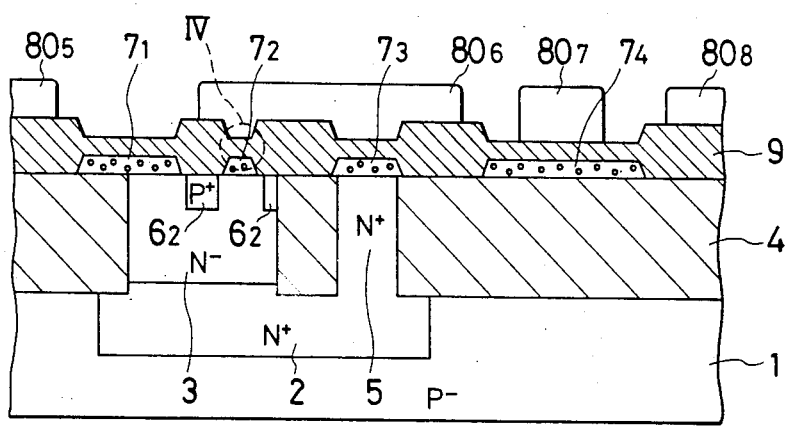
Figure 4:
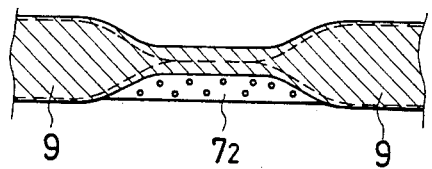

The silicon nitride films or the upper layers of the oxidation-resistant layer $8_1$ to $8_4$ are removed, and oxidation is conducted to increase the thickness of the silicon oxide film on the polysilicon layers $7_1$ to $7_4$ as shown in FIG. 2D and FIG. 4. If the inital thickness of the polysilicon layer is 3000 Å, the thickness of the above mentioned silicon oxide film should preferably be made to be 2000 Å, with the thickness of the remaining polysilicon layers $7_1$ to $7_4$ being 2000 Å. However, the oxide film over the polysilicon layer $7_3$ to form a collector electrode will be thicker than other polysilicon layers, because of the high concentration of phosphorus. The thickness difference is 100 to 200 Å where a wet oxidation of about 950 C is employed.

After that, resist layers $80_5$ to $80_8$ are formed and boron is ion-implanted, using the resist layers $80_5$ to $80_8$ as a mask, through the oxide films into the polysilicon layer $7_1$ to become the base electrode and part of the polysilicon layer $7_4$ to become the resistor, at a dose of $10^{15}$ to $10^{16}$ cm$^{-2}$. And after removal of the resist layers $80_5$ to $80_8$, the boron is additionally ion-implanted at a dose of about $5 \times 10^{14}$ cm$^{-2}$ throughout the entire surface.

The energy for the ion-implantation in the both steps with the films or layers of the thicknesses described above is preferably 70 to 80 KeV. If necessary annealing may be conducted after the above-mentioned removal of the resist layers and before the second ion implantation.

In the example of FIGS. 2A to 2H, the polysilicon resistor has a relatively high resistance, and the polysilicon layer $7_4$ has a higher concentration of boron at near the parts where contact holes will be formed and has a lower concentration of boron at the central part. The sheet resistance of the low-concentration part which determines the resistance ultimately becomes 1 KΩ/square.

It is also possible to form a low-resistance resistor having a sheet resistance of 100 to 200 Ω/square if the resist layer $80_7$ is not provided and the above-described two-step ion-implantation of boron is conducted.

After the ion-implantation, heat treatment is conducted in a non-oxidizing atmosphere, causing diffusion from the polysilicon layer $7_2$ containing a low concentration of boron and the polysilicon layer $7_1$ containing a high concentration of boron to form an active base layer $6_1$ and a low-resistance inactive base 10, respectively. And the active base and inactive base are connected by the high concentration base $6_2$ in the N⁻ epitaxial layer 3. Although diffusion also occurs from the polysilicon layer $7_3$ to the N⁺ collector sink region 5, the collector sink region has a high concentration of the N-type impurity, so that the P-type region is not formed.

Figure 2E:
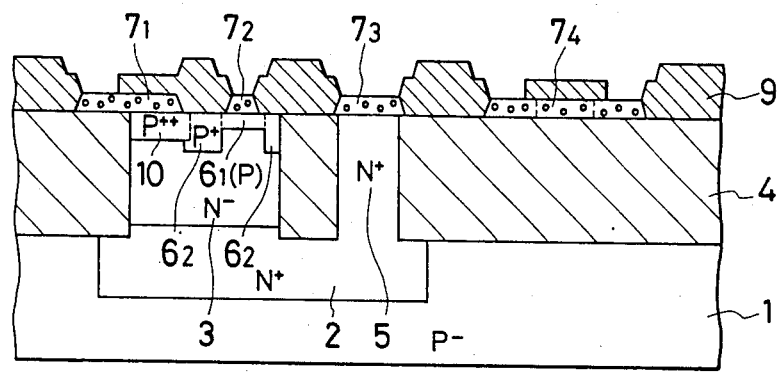

Contact holes are then opened to form a structure as shown in FIG. 2E. Here it should be noted that the oxide film at the periphery of the emitter need not be etched so excessively. This is because the oxide films on the polysilicon layers have been grown by thermal oxidation, in which case the thickness of the oxide is about proportional to the square root of the oxidation time and hence the oxide thickness difference between the periphery of the polysilicon patterns where the bird's beaks are formed and the central part of the polysilicon is reduced. For instance, at a periphery where the initial thickness of the bird's beak is 500 Å, the oxide film may grow to a total thickness of 2200 Å after a certain thermal oxidation while the oxide film at a central position where no bird's beak was present may grow to a total thickness of 2000 Å after the same thermal oxidation. Accordingly, it is sufficient at this etching to remove the thickest oxide on the collector contact, because the presence of phosphorus accelerates the growth of the silicon oxide film as described above.

Figure 2F:
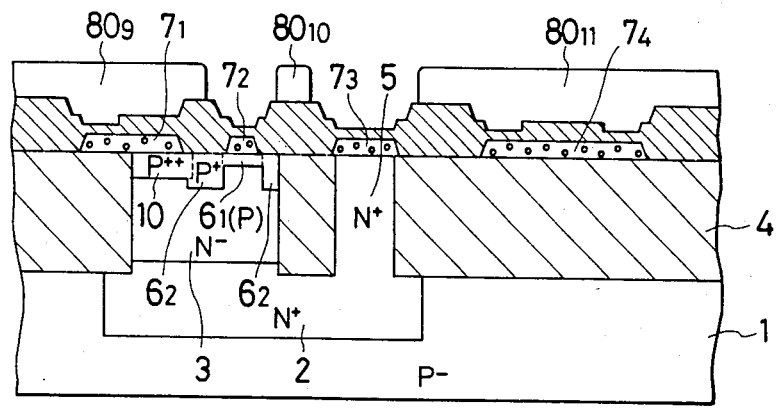

Subsequently, as shown in FIG. 2F, the polysilicon is thermally oxidized to form thin oxide films on the surface at the contact holes, and, using the resist layers $80_9$ to $80_{11}$ as a mask, arsenic is ion-implanted at a dosage of $10^{16}$ cm⁻² into the polysilicon layers $7_2$ and $7_3$ over the emitter and the collector.

The thin oxide film is used, in a subsequent heat treatment, to prevent outdiffusion of impurities, to make uniform the diffusion into the epitaxial layer. A thickness of about 100 Å is sufficient.

Figure 2G:
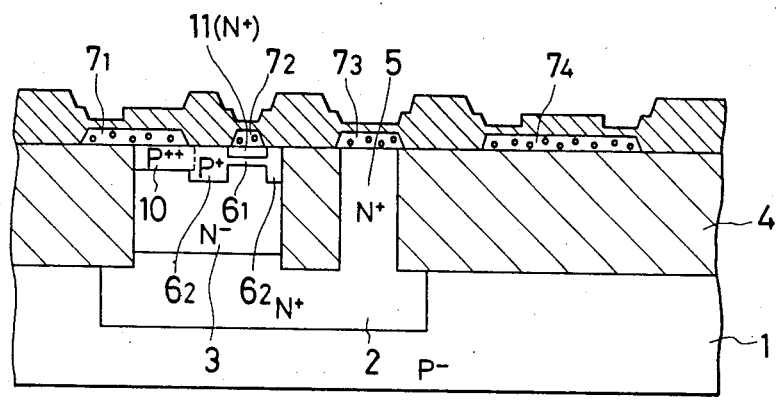
Figure 2H:
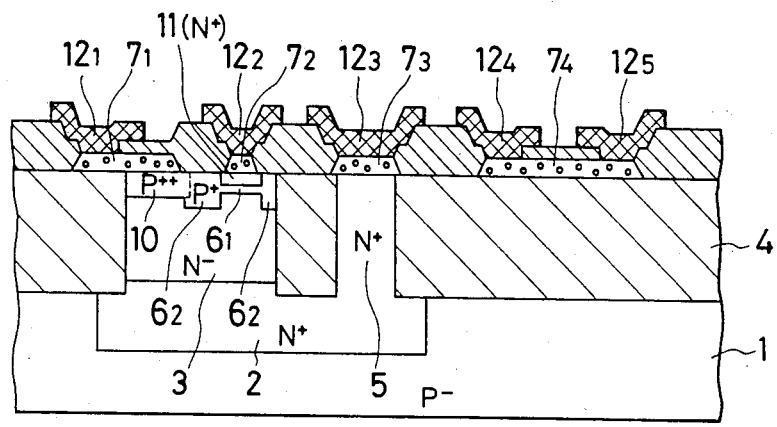

Next, the resist layers $80_9$ to $80_{11}$ are removed and a heat treatment is conducted in a non-oxidizing atmosphere to form an emitter 11 in the active base $6_1$ in FIG. 2G. Finally, the entire oxide film is lightly etched to expose the polysilicon at the contact holes, and then metal electrode wiring conductors $12_1$ to $12_5$ are formed in FIG. 2H.

Figure 1D:
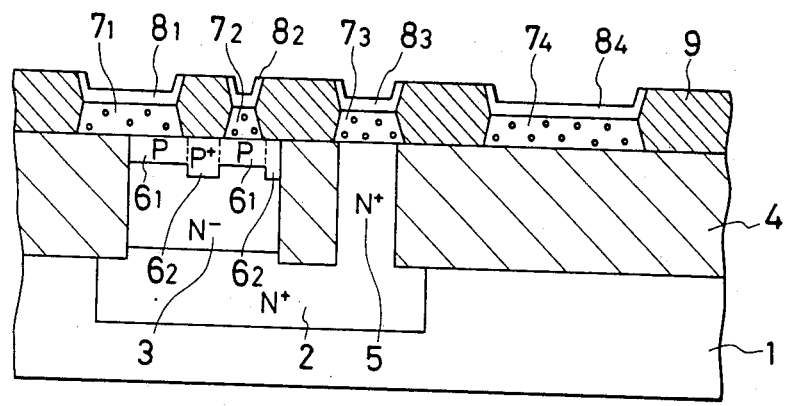
Figure 1E:
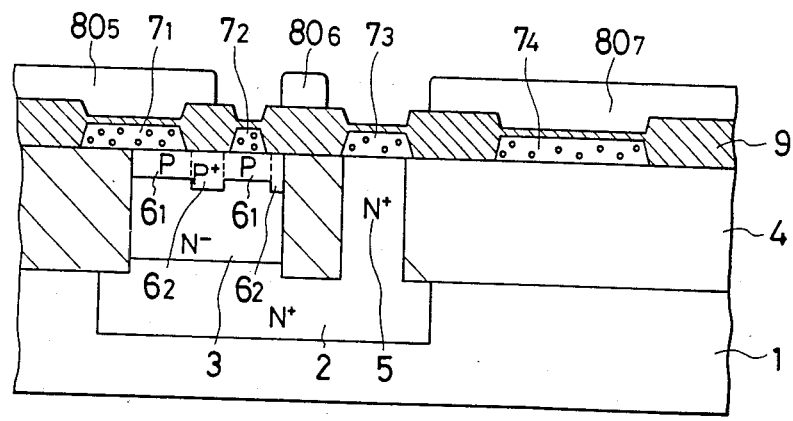
Figure 1F:
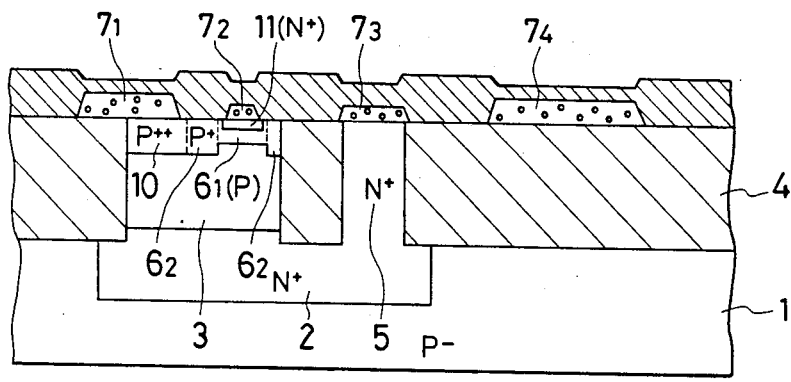
Figure 1G:
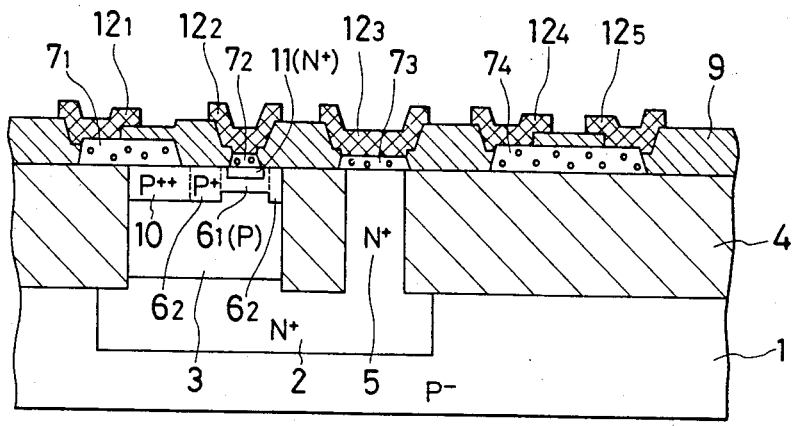

As has been described according to the above-described embodiment, the extensive heat treatment, such as the selective oxidation in FIG. 1D and the thermal oxidation in FIG. 1F of the prior art, which cause the diffusion between the steps of formation of the active base $6_1$ and the formation of the emitter is eliminated. Thus, the advantages of the prior art of having a small parasitic capacitance and low base resistance are maintained, while at the same time the active base-collector junction is made to be 0.2 micrometers or less, so that there in a possibility that the gain-bandwidth product $f_T$ of 10 GHz or more is realized. The operation speed of the semiconductor IC device can therefore be further increased.

Moreover, by thermally oxidizing the surface of the polysilicon to form polysilicon oxide films, without first removing the bird's beak produced at the time of the selective oxidation of the polysilicon, the difference in the thickness of the oxide films at the center of the polysilicon and at the periphery of the polysilicon where there has been bird's beak is reduced and a contact hole is opened, and arsenic is introduced into the polysilicon in the emitter region through the contact hole. Accordingly, arsenic can be sufficiently injected. The excessive etching which was necessary in the prior art to remove the bird's beak to sufficiently inject arsenic is no longer required. The danger of part of the base adjacent the emitter being exposed and shorted with the emitter by metalization is eliminated, and the production margin is expanded.

Furthermore, there is no high temperature heat treatment between the step of forming the active base $6_1$ and the step of forming the emitter that affects the junction depth. Rather, the active base and the emitter are formed in succession by diffusion from the same polysilicon layer $7_2$. If there is a deviation, fluctuation or variation in the thickness and the pattern size of the polysilicon layer, the junction depth of the active base and the emitter are increased or decreased in proportion so that the effects of the variations cancel each other.

For this reason, difference in the characteristic, particularly the current amplification factor $h_{FE}$ between one area of the wafer to another, or between one wafer to another is reduced. Reproducibility between different production lots is improved.

In addition, two different types of resistors, one having a low resistance and the other having a high resistance can be formed simultaneously with the inactive base and with the active base, respectively. This is advantages because in bipolar ICs in general, resistors of a wide range of resistance, from several tens of Ω to several tens of KΩ are formed on a small area. Availability of several types of resistor layers is therefore an advantage. To form two resistor layers in the prior art, additional steps of masking and ion-implantation were necessary. The invention in effect obviates the necessity of the ion-implantation for forming the active base, thereby to reduce the production steps.

As has been described, according to the invention, the active base and the emitter are formed successively by diffusion from the same polysilicon layer, and the junction can be made shallow. Moereover, excessive etching at the periphery of the emitter is eliminated. As a result, a circuit element with stable characteristic and suitable for high speed operation can be fabricated by reduced production steps. Moreover, a high gain-bandwidth product $f_T$ enabling high-speed operation is easily obtained. Furthermore, production margin against emitter-base short-circuiting is increased. In addition, uniformity and reproducibility of characteristic are improved. The invention can be applied to various semiconductor IC devices, including the ECL/CML high speed LSI devices.

What is claimed is:

1. A process of fabricating a semiconductor IC device comprising the steps of:
   (a) preparing a semiconductor substrate (1) having a first region (3) of a first conduction type which is electrically isolated,
   (b) forming a polycrystalline semiconductor layer (7) on the semiconductor substrate,
   (c) forming oxidation-resistant layers ($8_1$, $8_2$) on the polycrystalline semiconductor layer,
   (d) forming, in part of the first region that is not covered by the oxidation-resistant layers, second regions ($6_2$, $6_2$) of a second conduction type,
   (e) selectively oxidizing parts of the polycrystalline semiconductor layer that are not covered by the oxidation-resistant layers,
   (f) removing the oxidation-resistant layers,
   (g) introducing an impurity of the second conduction type in the polycrystalline semiconductor layers,
   (h) diffusing the impurity from the polycrystalline semiconductor layers into parts of the first regions beneath the polycrystalline semiconductor layers to form therein, a third region (10) and a fourth region ($6_1$) of the second conduction type,
   (i) exposing selected parts of the surfaces of the polycrystalline layers,
   (j) introducing an impurity of the first conduction type in the polycrystalline semiconductor layer on the fourth region ($6_1$) through the exposed surface, and
   (k) diffusing the impurity from the polycrystalline layer into part of the fourth region to form therein a fifth region (11) of the first conduction type.

2. A process according to claim 1, further comprising the steps of thermally oxidizing the surface of the polycrystalline layer after the removal of the oxidation-resistant layers at step (f) and before the introduction of the impurity at step (g).

3. A process according to claim 1, wherein, at step (g) the impurity is introduced to a high concentration into a first part ($7_1$) of the polycrystalline semiconductor layer and to a low concentration into a second part ($7_2$) of the polycrystalline semiconductor layer.

4. A process according to claim 3, wherein the impurity is introduced by ion-implantation into the first part ($7_1$) and the second part ($7_2$) of the polycrystalline semiconductor layer, and by additional ion-implantation with a resist layer covering the second part ($7_2$) of the polycrystalline semiconductor layer, the high concentration of the impurity in the first part ($7_1$) of the polycrystalline semiconductor layer is achieved.

5. A process according to claim 1, wherein at step (d) an impurity of the second conduction type is ion-implanted through the polycrystalline semiconductor layer, with the oxidation-resistant layers acting as a mask against the ion-implantation.

6. A process according to claim 1, wherein the preparation of the semiconductor substrate at step (a) comprises (a1) forming, in a semiconductor substrate of the second conduction type, a buried layer (2) of the first conduction type and an epitaxial layer (3, 5) of the first conduction type, and (a2) forming an element isolation formed at least partially of an insulating layer.

7. A process according to claim 1, wherein the first region is divided into two regions, the second to the fifth regions are formed in one of the two regions, and a sixth region (5) of the first conduction type is formed in the other of the two regions.

8. A process according to claim 7, wherein the formation of the sixth region (5) is carried out before the formation of the polycrystalline semiconductor layer.

9. A process according to claim 1, wherein the formation of the polycrystalline semiconductor layer is implemented by deposition.

10. A process according to claim 1, wherein after exposing the surfaces of the polycrystalline layers at step (i), the polycrystalline layers are oxidized to form thin oxide layers on the polycrystalline layers.

11. A process according to claim 1, wherein the semiconductor substrate is a silicon substrate, the insulating layer is a silicon oxide layer, the polycrystalline semiconductor layer is polycrystalline silicon layer, and the oxidation-resistant layer consists of a silicon oxide film and a silicon nitride film on the silicon oxide film.

12. A process according to claim 1, wherein the first conduction type is n-type, and the second conduction type is p-type.

13. A process according to claim 12, wherein the impurity of the first conduction type is arsenic, and the impurity of the second conduction type is boron.

14. A process according to claim 1, wherein the first region is used as a collector, the fourth region is used as an active base, the fifth region is used as the emitter, the second regions are high concentration inactive-base regions, and the third region is a high concentration inactive base region connecting one of the second regions and the polycrystalline semiconductor layer thereon.

15. A process according to claim 14, wherein the polycrystalline semiconductor layer on the fifth region is used as an emitter electrode, the polycrystalline semiconductor layer on the third region is used as a lead for a base electrode.

* * * * *